(12) United States Patent
Ucar

(10) Patent No.: US 9,893,730 B1
(45) Date of Patent: Feb. 13, 2018

(54) THREE RAIL LEVEL SHIFTER

(71) Applicant: Advanced Micro Devices, Inc., Sunnyvale, CA (US)

(72) Inventor: Talip Ucar, Sunnyvale, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/475,865

(22) Filed: Mar. 31, 2017

(51) Int. Cl.
*H04L 25/49* (2006.01)
*H03K 19/0185* (2006.01)
*G05F 3/20* (2006.01)

(52) U.S. Cl.
CPC ..... *H03K 19/018521* (2013.01); *G05F 3/205* (2013.01); *H04L 25/49* (2013.01)

(58) Field of Classification Search
CPC .. H03K 19/018521; G05F 3/205; H04L 25/49
See application file for complete search history.

(56) References Cited

U.S. PATENT DOCUMENTS

| 4,984,214 A * | 1/1991 | Hiltebeitel | G11C 11/4096 365/230.02 |
| 6,407,579 B1 | 6/2002 | Goswick | |
| 7,227,400 B1 * | 6/2007 | Gillespie | H03K 19/00315 327/333 |
| 8,502,317 B2 | 8/2013 | van den Berg et al. | |
| 9,755,621 B1 * | 9/2017 | Sinha | H03K 3/356113 |
| 2002/0084802 A1 * | 7/2002 | Elamanchili | H03K 3/356017 326/68 |
| 2008/0231568 A1 * | 9/2008 | Chen | G09G 3/346 345/84 |
| 2011/0148536 A1 * | 6/2011 | Italia | H03B 5/1268 331/117 FE |
| 2017/0237438 A1 * | 8/2017 | Terletzki | H03K 19/018521 326/81 |

* cited by examiner

*Primary Examiner* — Jaison Joseph

(57) ABSTRACT

A level shifter generates at least three separate voltage rails. The level shifter features two cross-coupled devices coupled together in parallel by a capacitor. A first stage includes a PMOS cross-coupled device in series with a PMOS cascode circuit that generates an upper voltage rail. A second stage includes a NMOS cross-coupled device in series with a NMOS cascode circuit that generates a lower rail. A third stage includes the PMOS cascode circuit and the NMOS cascode circuit that together are configured to generate a third voltage rail.

20 Claims, 4 Drawing Sheets

THREE RAIL LEVEL SHIFTER

CROSS-REFERENCE TO RELATED APPLICATIONS

This application is related to U.S. patent application Ser. No. 15/476,203, filed on even date herewith, entitled High Speed Transmitter, to Talip Ucar, which is herein incorporated by reference for all purposes.

BACKGROUND

Integrated circuits include a plurality of different voltage domains, with each voltage domain including components that operate at a corresponding voltage level, with each voltage domain corresponding to a different voltage level. For example, most modules of an integrated circuit are located in a voltage domain connected to a low supply voltage to save power. However, the integrated circuit might also include one or more modules that require a higher voltage level. Accordingly, such high-voltage modules might be located in a high-voltage domain of the integrated circuit. The integrated circuit might also include modules that operate at a lower supply voltage and are therefore included in a voltage domain connected to a relatively low supply voltage. The integrated circuit might include one or more level shifters that change the voltage of a signal used to communicate data between different voltage domains.

BRIEF DESCRIPTION OF THE DRAWINGS

For a better understanding of the disclosure and the various implementations described herein, reference is now made to the following brief description, taken in connection with the accompanying drawings and detailed description, which show at least one exemplary implementation.

DETAILED DESCRIPTION

The present disclosure provides a circuit that implements a level shifter that generates three rails of voltage and is used as a pre-driver in a transmitter circuit. The three rails of voltage include an upper rail, a mid-rail and a lower rail. The mid-rail voltage is an intermediate voltage that is either at a ground voltage level, VSSL, of the upper rail or at a supply voltage level, VDD, of the lower rail. The level shifter uses two cross-coupled devices with a capacitor in-between the cross-coupled devices to separately generate the upper rail and the lower rail. The level shifter uses cascode devices to generate the mid-rail. The level shifter can program the voltage levels of the upper rail and lower rail depending on the system application. The level shifter can therefore be implemented in a wide variety of integrated circuits without requiring modification or redesign, thereby simplifying the design and reducing the cost of the integrated circuits.

Figure 1:
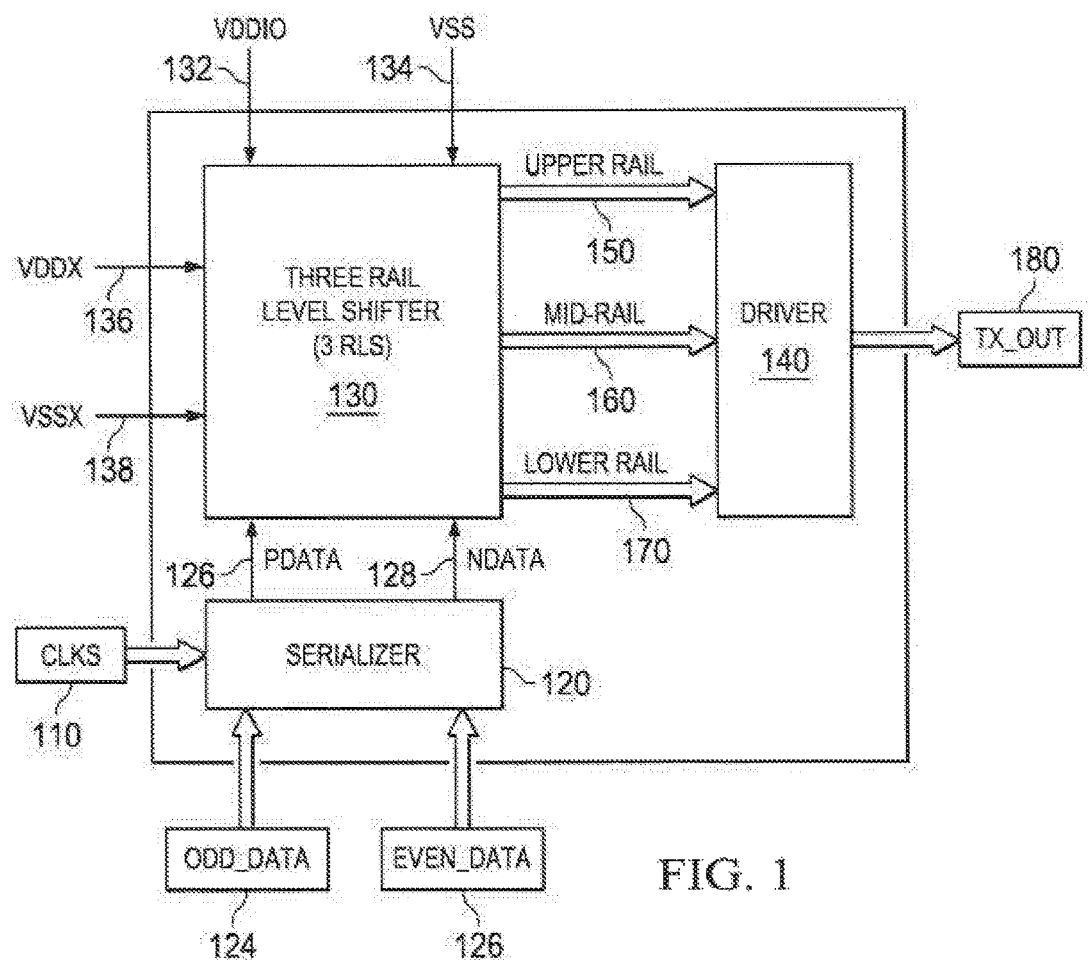
FIG. 1 illustrates an exemplary system in accordance with illustrative implementations of the disclosure.

Turning first to FIG. 1, an exemplary system in accordance with illustrative implementations of the disclosure is illustrated. The illustrated system includes transmitter 100 including a Serializer 120, Three Rail Level Shifter (3RLS) 130 and Driver 140. Transmitter 100 is connected to supply voltages VDDIO 132 and VSS 134. VDDIO 132 and VSS 134 is generated externally or by an internal power supply (not shown). In one implementation, VDDIO 132 has a value of, for example, 1.35 volts. In one implementation, VSS is considered as ground or zero volts.

Transmitter 100 also receives data. In one implementation, transmitter 100 receives two separate data streams, Odd_Data 124 and Even_Data 126, to Serializer 120. Transmitter 100 can also receive clock signals, designated Clks 110, for the operation of Serializer 120. The Transmitter 100 can also be connected to one or more externally generated bias voltages such as, for example, VDDX 136 and VSSX 138, to define a level of gate voltages within the 3RLS 130 of transmitter 100. In one implementation, VDDX 136 and VSSX 138 is generated by diodes connected to a reference voltage (not shown). In another implementation, VDDX 136 and VSSX 138 is generated by programmable reference generators, such as, without limitation, a regulator. 3RLS 130 functions as a pre-driver circuit that can be coupled to driver 140. Transmitter 100 outputs a stream of digital data TX_OUT 180.

As illustrated, Serializer 120 inputs two data streams, such as odd_data 124 and even_data 126, and drives a single stream of data to the 3RLS 130. In one implementation, Serializer 120 outputs a stream of data that is single-ended. The differential data is output as complementary data signals, such as positive data, PData 126 and negative data, NData 128. 3RLS 130 is configured to generate an upper rail 150, a mid-rail 160, and a lower rail 170. Upper rail 150, mid-rail 160, and lower rail 170 are different voltages. Upper rail 150 has a voltage that can range between the supply voltage VDDIO 132 and a mid-level voltage VSSL (not shown) that is determined based on bias voltage VSSX 138. Mid-rail 160 has a voltage that ranges between VDDIO 132 and VSS 134. Lower rail has a voltage that ranges between VSS 134 and a mid-level voltage VDD (not shown) as determined based on the bias voltage VDDX 136. The 3RLS 130 can therefore be used in a variety of integrated circuits with different voltage requirements. In the depicted example, driver 140 is configured to accept one or more voltage rails generated by 3RLS 130 and output serial data, TX_OUT 180.

Figure 2:
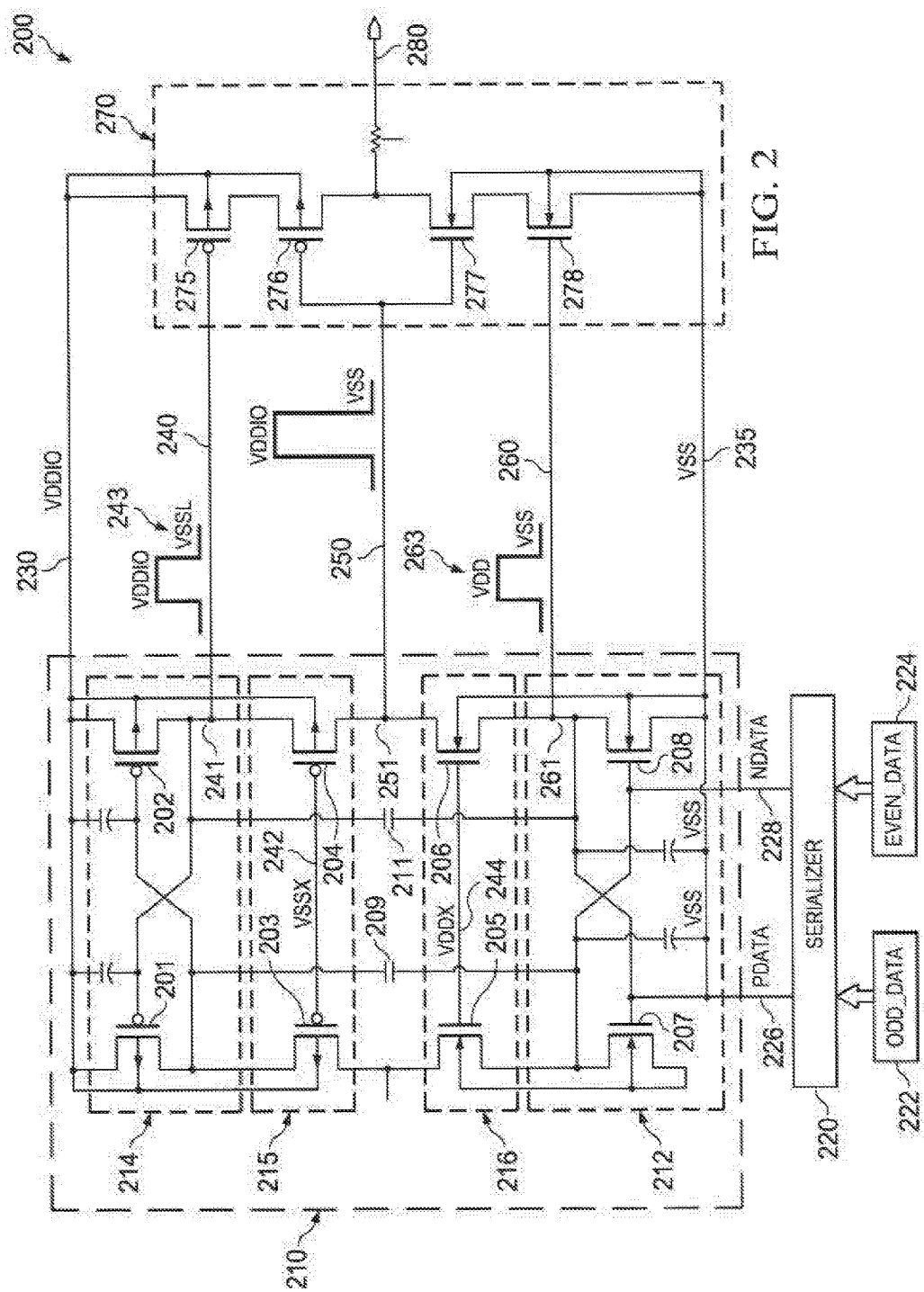
FIG. 2 illustrates a detailed circuit diagram of the exemplary system of FIG. 1 showing a level shifter outputting three voltage rails to drive an output circuit in accordance with an illustrative implementation of the disclosure.

Referring now to FIG. 2, a detailed circuit 200 of the exemplary system of FIG. 1 showing a level shifter 210 outputting three voltage rails to drive an output circuit in accordance with an implementation of the disclosure is illustrated. In operation, Serializer 220 performs a two-to-one serialization of data by inputting two data streams, odd_data 222 and even_data 224. Serializer 220 combines odd-data 222 and even_data 224 into a single data stream that is output to 3RLS 210. In an illustrative implementation, the single data stream represents differential data signals PData 226 and NData 228. Differential signals are equal but complementary signals that transmit information at a same time.

PData 226 and NData 228 can be differential signals input to 3RLS 210. Level shifter 3RLS 210 features two cross-coupled devices, n-type metal oxide semiconductor (NMOS) cross coupled device 212 and p-type metal oxide semiconductor (PMOS) cross-coupled device 214. NMOS cross-coupled device 212 is comprised of NMOS transistors 207 and 208. Capacitors 209 and 211 are AC coupling capacitors that are situated between the NMOS cross-coupled device 212 and the PMOS cross-coupled device 214. Serializer 220 directly drives the NMOS cross-coupled devices 212 with PData 226 and NData 228. AC coupling capacitors 209 and 211 enable the PMOS cross-coupled device 214 to transition data in tandem or soon after the NMOS cross-coupled devices 212.

NMOS cascode device 216 is situated in series to NMOS cross-coupled device 212. PMOS cascode device 215 is situated in series to PMOS cross-coupled device 214. PMOS cascode device 215 and NMOS cascode device 216 can control the generation of mid-rail 250. A bias voltage VSSX 242 is applied to the gate of PMOS transistor 203 and PMOS transistor 204 of PMOS cascode device 215 to determine the ground voltage level, VSSL 243, of upper voltage rail 240. Similarly, a bias voltage VDDX 244 can be applied to the gate of NMOS transistor 205 and NMOS transistor 206 of NMOS cascode device 216 to determine a supply voltage level, VDD 263, of lower rail 260.

Turning now to the operation of circuit 200, for ease of illustration purposes, one side of 3RLS 210 is referenced in illustrating the circuit operation, and that same operation applies to the mirror side of 3RLS 210. In operation, Serializer 210 can output a logic "1" to 3RLS 210. Logic "1" means that PData 226 is pulled up to a power supply value of the Serializer 220 and the complementary signal NData 228 is pulled to ground. In the illustrative implementation, PData 226 is pulled to a power supply value of the Serializer 220 which is different from the power supply value VDDIO 230 of the 3RLS 210. In some implementations, the power supply value of Serializer 220 is about 0.85 Volts.

The logic "1" input to 3RLS 210 is first input to NMOS cross-coupled device 212. NMOS transistor 207 switches on and NMOS transistor 208 switches off. Node 261 is set to a value that is modulated by a bias voltage VDDX 244 the gate-to-source voltage across NMOS transistor 206. In one implementation, node 261 is set to a value of VDDX −0.85 V. That value VDD 263 sets the lower rail 260. NMOS cascode device 216 amplifies the value VDD 263 at its source node 261. Thus, VDD 263 is amplified to a higher voltage value of VDDIO 263 at node 251. This sets mid-rail 250 to VDDIO 230.

The PMOS cross-coupled device 214 recognizes the logic "1" across AC coupling capacitors 209 and 211. PMOS transistor 202 of PMOS cross-coupled device 214 switches on while PMOS transistor 201 of PMOS cross-coupled device 214 is turned off and node 241 is set to a voltage value, VDDIO 230. Thus, the upper rail 240 is set to VDDIO 230. PMOS cascode device 215 amplifies the value at its source node 241. Thus, node 251 is set to VDDIO 230 and mid-rail 250 outputs voltage value VDDIO 230.

To summarize, in this exemplary implementation, driving a logic "1" to 3RLS 210, can cause the 3RLS 210 to drive an upper rail 240 voltage of VDDIO 230, a mid-rail of VDDIO 230 and a lower rail of VDD 263.

Conversely, data that is a logic "0" can be input to 3RLS 210. Logic "0" means that the input at PData 226 is pulled to ground or a value of zero volts. The logic "0" input to 3RLS 210 is first input to NMOS cross-coupled device 212. NMOS transistor 207 switches off and NMOS transistor 208 switches on. Since NMOS transistor 208 is turned on, node 261 is set to VSS 235. Thus, lower rail 260 is set to VSS 235. NMOS cascode device 216 amplifies the value VSS 235 at its source node 261. Thus, VSS 235 is reflected at node 251. Thus, mid-rail 250 is set to VSS 235.

The PMOS cross-coupled device 214 recognizes the logic "0" across AC coupling capacitors 209 and 211. PMOS transistor 202 switches off while PMOS transistor 201 is turned on. Node 241 is set to voltage value of VSS 235 modulated by a bias voltage, VSSX 242, the gate-to-source voltage across PMOS transistor 204. Thus, upper rail 240 is set to a voltage value of VSSX 242 minus VSS 235 or VSSL 243. Thus, upper rail 240 is set to VSSL 243. PMOS cascode device 215 and NMOS cascode 216 act as amplifiers that reflect the logic value being driven the source nodes of their transistors. Thus, as the source node 251 of PMOS transistor 202 is being driven by VSSL 243, PMOS transistor 204 of PMOS cascode device 215 reflects and amplifies VSSL 243 at node 251. Thus, the mid-rail 250 of 3RLS 210 drives a value of VSS 235. To summarize, in this exemplary implementation, driving a logic "0" to 3RLS 210 causes the 3RLS 210 to drive an upper rail 240 voltage of VSSL 243, a mid-rail of VSS 235 and a lower rail of VSS 235.

Upper voltage rail signal 240 can therefore be configured to swing between supply voltage VDDIO 230 and generated voltage VSSL 243. VSSL 243 is based on bias voltage VSSX 242. Similarly, for the NMOS cascode device 216, a second bias voltage VDDX 244 can be applied to the gate of NMOS transistors 205 and 206 that controls the voltage swing at a node 261 to a generated voltage VDD 263. Lower voltage rail signal 260 is therefore enabled to swing between a ground VSS 235 and generated voltage VDD 263. The drain nodes of PMOS cascode device 215 and NMOS cascode device 216 are configured to generate a mid-rail 250 that swings between VDDIO 230 and VSS 235.

Output driver 270 include PMOS transistors 275 and 276 and NMOS transistors 277 and 278. In one implementation, output driver 270 is driven at about the same time by upper voltage rail 240, mid-voltage rail 250 and lower voltage rail 260. The gate of PMOS transistor 275 is driven by voltage rail 240 which is configured to swing between VDDIO 230 and VSSL 243. The gate of PMOS transistor 276 and NMOS transistor 277 are tied together and driven by the mid-rail 250 which is configured to swing between voltages VDDIO 230 and VSS 235. The gate of NMOS transistor 278 is driven by voltage rail 260 which is configured to swing between VDD 263 and VSS 235. Output driver 270 outputs a signal TxOut 280 that transmits data to a channel in a system.

The illustration of FIG. 2 is not meant to imply physical or architectural limitations for different implementations. Other components in addition and/or in place of the ones illustrated can be used. Some components could be unnecessary in some advantageous implementations. Also, the blocks are presented to illustrate some functional components. One or more of these blocks could be combined and/or divided into different blocks in different advantageous implementations. For example, in one implementation, 3RLS 210 is configured to drive one rail, two rails or all three rails depending on the requirements of the system in which it is placed. Additionally, the output driver can be configured to change the impedance of the channel by enhancing the output driver with multiple small drivers that are activated or deactivated based on the desired impedance.

Figure 3:
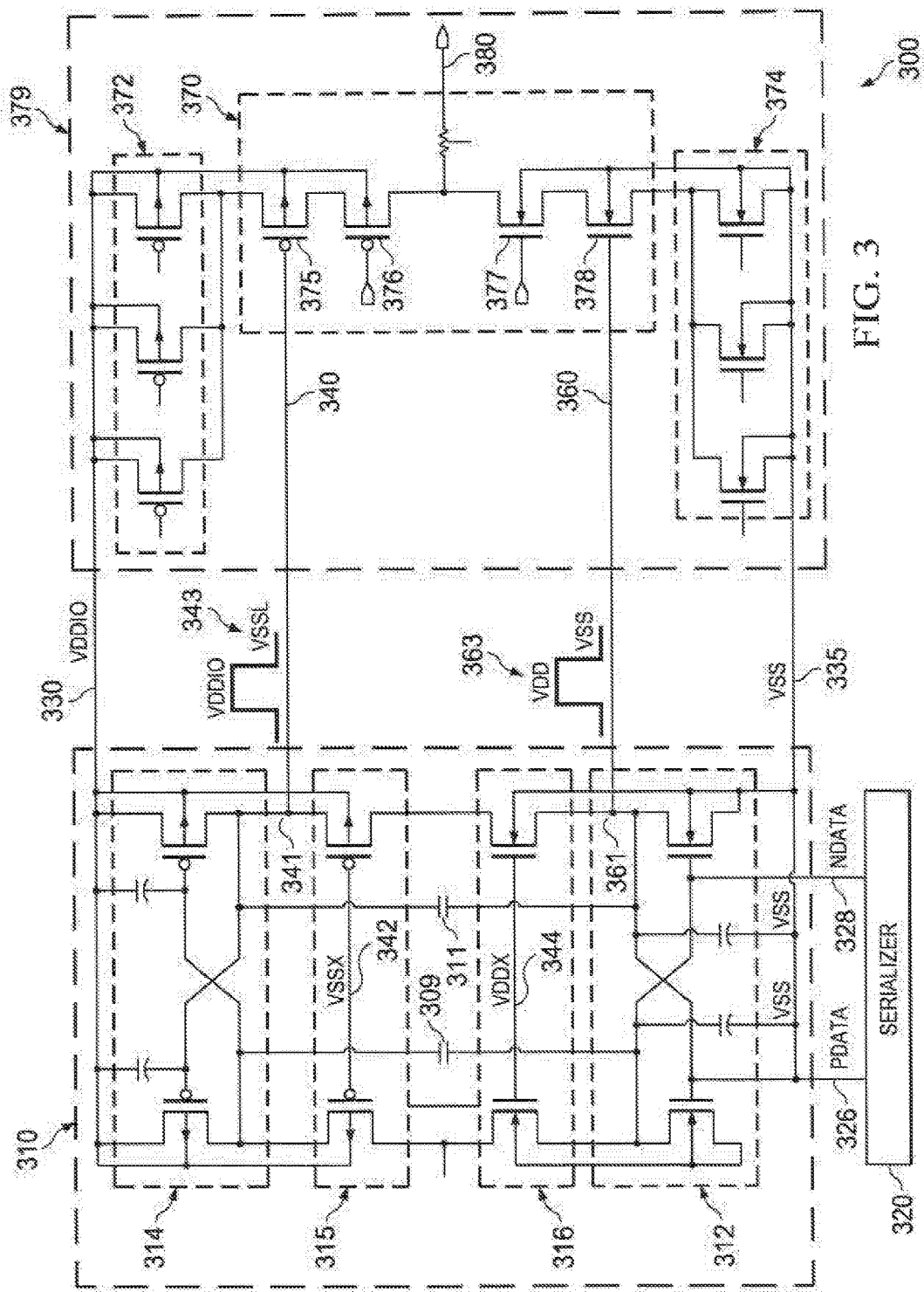
FIG. 3 illustrates a circuit diagram of the exemplary system showing a level shifter outputting two voltage rails to drive an output circuit in accordance with an illustrative implementation of the disclosure.

In FIG. 3, a circuit diagram illustrates an exemplary system showing a level shifter outputting two voltage rails to drive an output circuit in accordance with an illustrative implementation of the disclosure. The operation of circuit 300 is similar to the operation of circuit 200 in FIG. 2. In this exemplary implementation, Serializer 320 drives PData 326 and NData 328 into 3RLS 310. The NMOS cross-coupled device 312 stores the signal and enables the same change in signal values of the PMOS cross-coupled device 314 through AC coupling capacitors 309 and 311. PMOS cascode device 315 and NMOS cascode device 316 controls the generation of a mid-supply voltages VSSL 343 at nodes 341 and VDD 363 at node 361 based on bias voltages VSSX 342 and VDDX 344. In one implementation, the PMOS transistor 375 of output driver 379 is driven by upper rail 340 which is configured to swing between a supply voltage VDDIO 330 and generated voltage VSSL 343. The NMOS transistor 378 of output driver 379 is driven by lower rail 360 that is configured to swing between VDD 363 and VSS 335.

In one implementation, output driver 379 includes mid-device 370 comprised of PMOS transistors 375 and 376 and NMOS transistors 377 and 378, upper device 372 and lower device 374. PMOS transistor 375 and NMOS transistor 378 of mid-device 370 can be low voltage metal oxide semiconductor field effect transistors (MOSFETs). In another implementation, PMOS transistor 375 and NMOS transistor 378 are high voltage MOSFETs. In an implementation, top and bottom devices 372 and 374 are used to tune or change the impedance of circuit 300. In the illustrated implementation, 3RLS 310 is configured to drive output driver 379 with upper rail 340 and lower rail 360.

Figure 4:
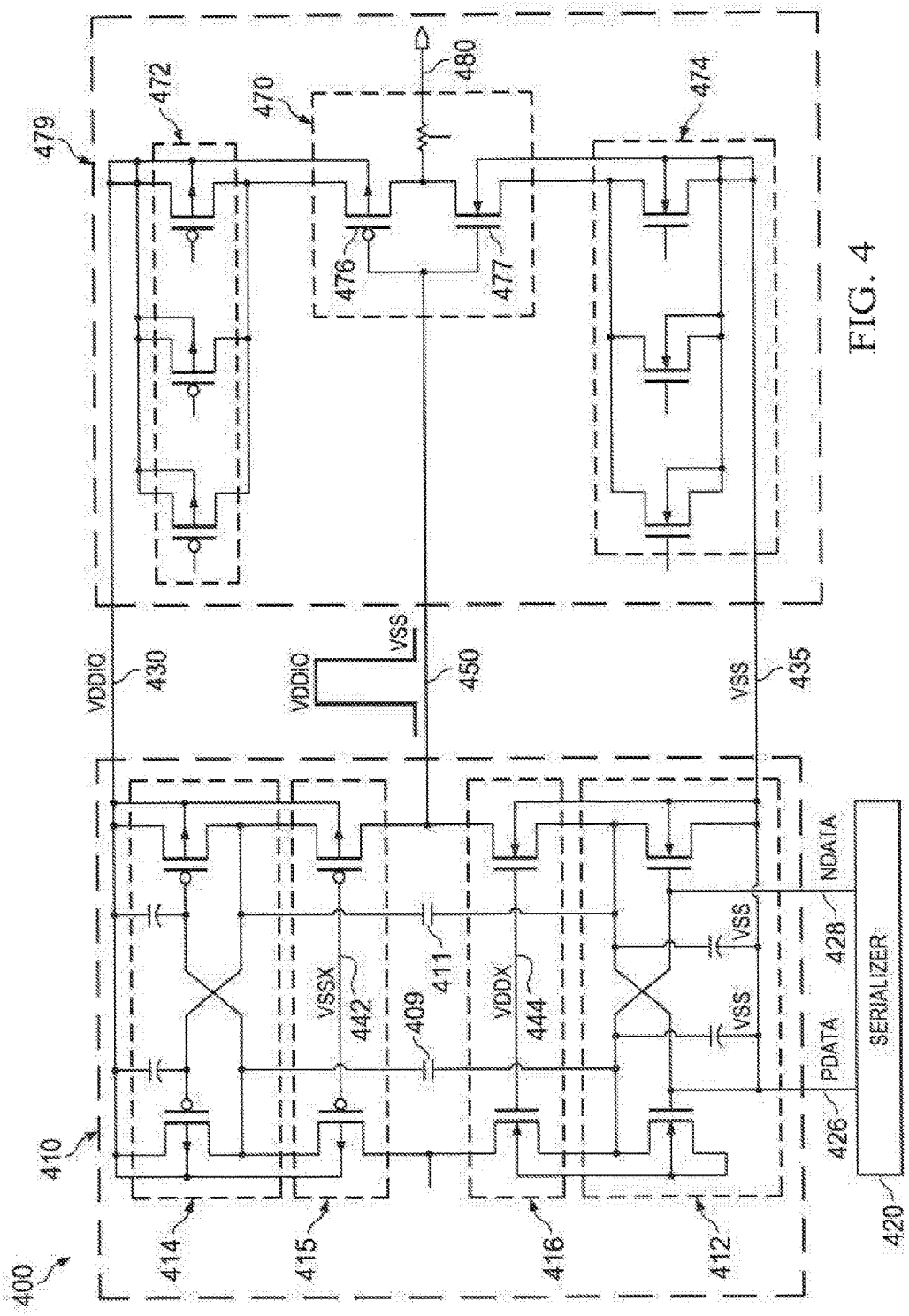
FIG. 4 illustrates a circuit diagram of the exemplary system showing a level shifter outputting a single voltage rail to drive an output circuit in accordance with an illustrative implementation of the disclosure.

Turning now to FIG. 4, a circuit diagram of the exemplary system is illustrated showing a level shifter outputting a single voltage rail to drive an output circuit in accordance with an illustrative implementation of the disclosure. The operation of circuit 400 is similar to the operation of circuit 200 in FIG. 2. Circuit 400 illustrates mid-rail 450 driving output driver 479. Serializer 420 inputs data, PData 426 and NData 428, to 3RLS 410. 3RLS 410 features NMOS cross-coupled device 412 in series with NMOS cascode device 416 and PMOS cross-coupled device 414 in series with PMOS cascode device 415. AC coupling capacitors 409 and 411 are situated to connect the NMOS cross-coupled device 412 with the PMOS cross-coupled device 414. NMOS cascode device 416 and PMOS cascode device 415 reflects and amplifies the voltage at their source nodes to enable the generation of mid-rail 450. Mid-rail 450 is configured to swing between supply voltage VDDIO 430 and ground, VSS 435. In this implementation, PMOS transistor 476 and NMOS transistor 477 of output driver 479 are high voltage MOSFETS. Output driver 479 includes mid-device 470, upper device 472 and lower device 474. Upper device 472 and lower device 474 are used to change the impedance of circuit 400. Mid-device includes PMOS transistor 476, NMOS transistor 477. Mid-rail 450 drives the gates of mid-device 470.

In some implementations, certain aspects of the techniques described above might be implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium could be in source code, assembly language code, object code, or other instruction format that is interpreted or otherwise executable by one or more processors.

A computer readable storage medium might include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium might be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device might not be required, and that one or more further activities might be performed, or elements included, in addition to those described. Still further, the order in which activities are listed are not necessarily the order in which they are performed. Also, the concepts have been described referring to specific implementations. However, one of ordinary skill in the art appreciates that various modifications and changes can be made without departing from the scope of the present disclosure as set forth in the claims below. For example, a PMOS transistor is referenced as P-type MOSFET and a NMOS transistor is referenced as a N-type MOSFET.

The various implementations of the present disclosure provide a 3RLS that outputs three voltage rails which drive one or more output circuits simultaneously using the voltage rails. The 3RLS is configured to operate at very high frequencies and in systems that require high voltage supplies. In some applications, the 3RLS functions as a pre-driver in a transmitter circuit that shifts the level of voltage of a signal and drives an output driver with an upper rail, mid-rail and lower rail depending on the requirements of the output driver.

Benefits, other advantages, and solutions to problems have been described above with regards to specific implementations. However, the benefits, advantages, solutions to problems, and any feature(s) that cause any benefit, advantage, or solution to occur or become more pronounced are not to be construed as a critical, required, or essential feature of any or all the claims. Moreover, the one or more implementations disclosed above are illustrative only, as the disclosed subject matter can y be modified and practiced in different but equivalent manners apparent to those skilled in the art having the benefit of the teachings herein. No limitations are intended to the details of construction or design herein shown, other than as described in the claims below. It is therefore evident that the particular implementations disclosed above might be altered or modified and all such variations are considered within the scope of the disclosed subject matter. Accordingly, the protection sought herein is as set forth in the claims below.

What is claimed is:
1. A level shifter circuit comprising:
a P-type MOSFET cross-coupled device;
a N-type MOSFET cross-coupled device in parallel with the P-type MOSFET cross-coupled device;

a pair of capacitors, each capacitor of the pair of capacitors coupled between the P-type MOSFET cross-coupled device and the N-type MOSFET cross-coupled device;
a PMOS cascode device connected in series to the P-type MOSFET cross-coupled device and to a first bias voltage; and
a NMOS cascode device connected in series to the N-type MOSFET cross-coupled device and a second bias voltage.

2. The level shifter circuit of claim 1, wherein the P-type MOSFET cross-coupled device comprises a first PMOS transistor and a second PMOS transistor connected in series to a first PMOS cascode transistor and a second PMOS cascode transistor of the PMOS cascode device.

3. The level shifter circuit of claim 2, wherein the N-type MOSFET cross-coupled device comprises a first NMOS transistor and a second NMOS transistor connected in series to a first NMOS cascode transistor and a second NMOS cascode transistor of the NMOS cascode device.

4. The level shifter circuit of claim 3, wherein the P-type MOSFET cross-coupled device is connected to the PMOS cascode device at source nodes of the first PMOS cascode transistor and the second PMOS cascode transistor.

5. The level shifter of claim 3, wherein a gate of the first cascode PMOS transistor and a gate of the second cascode PMOS transistor is connected to the first bias voltage.

6. The level shifter of claim 3, wherein a gate of the first NMOS cascode transistor and a gate of the second NMOS cascode transistor is connected to the second bias voltage.

7. The level shifter of claim 1, wherein the first bias voltage and the second bias voltage are generated by a programmable reference generator.

8. A multi-rail level shifter circuit, comprising:
a first circuit stage configured to drive a first voltage rail between a first input voltage and a first generated voltage;
a second circuit stage configured to drive a second voltage rail between a second input voltage and a second generated voltage; and
a third circuit stage configured to drive a third voltage rail between the first voltage rail and the second input voltage,
wherein the third circuit stage is coupled to the first circuit stage and the second circuit stage.

9. The multi-rail shifter circuit of claim 8, wherein the first circuit stage comprises:
a P-type MOSFET cross-coupled device; and
a PMOS cascode device connected in series to the P-type MOSFET cross-coupled device and to a first bias voltage.

10. The multi-rail shifter circuit of claim 9, wherein the second circuit stage comprises:

a N-type MOSFET cross-coupled device; and
a NMOS cascode device connected in series to the N-type MOSFET cross-coupled device and a second bias voltage.

11. The multi-rail shifter circuit of claim 10, wherein the third circuit stage comprises:
a PMOS cascode device connected in series to the P-type MOSFET cross-coupled device and to a first bias voltage; and
a NMOS cascode device connected in series to the N-type MOSFET cross-coupled device and a second bias voltage.

12. The multi-rail shifter circuit of claim 11, wherein the first bias voltage and the second bias voltage are generated by a regulator.

13. A transmitter, comprising:
a data generator configured to output a stream of differential data;
a level shifter that inputs the stream of differential data and is configured to generate three different rails of voltage; and
an output driver configured to transmit data based on a rail of voltage received from the level shifter.

14. The transmitter of claim 13, further comprising:
a serializer that sends data differentially to inputs of the level shifter.

15. The transmitter of claim 13, wherein the level shifter comprises:
a first circuit stage configured to drive a first voltage rail between a first input voltage and
a first generated voltage;
a second circuit stage configured to drive a second voltage rail between a second input voltage and a second generated voltage; and
a third circuit stage configured to drive a third voltage rail between the first voltage rail and the second input voltage,
wherein the third voltage circuit stage is coupled to the first circuit stage and the second circuit stage.

16. The transmitter of claim 15, wherein the output driver is driven only by the first voltage rail and the second voltage rail.

17. The transmitter of claim 15, wherein the output driver is driven only by the third voltage rail.

18. The transmitter of claim 15, wherein the output driver is driven by the first voltage rail, the second voltage rail, and the third voltage rail.

19. The transmitter of claim 13, wherein the output driver comprises a PMOS transistor and a NMOS transistor.

20. The transmitter of claim 19, wherein the PMOS transistor and the NMOS transistor of the output driver is a high voltage transistor.

* * * * *